(12) United States Patent
Zhu et al.

(10) Patent No.: US 10,955,482 B2
(45) Date of Patent: Mar. 23, 2021

(54) METHOD AND DEVICE FOR ACQUIRING BATTERY POWER LEVEL AND ELECTRONIC DEVICE

(71) Applicant: GOERTEK TECHNOLOGY CO., LTD., Qingdao (CN)

(72) Inventors: Shuangshuai Zhu, Qingdao (CN); Yong Qie, Qingdao (CN)

(73) Assignee: GOERTEK TECHNOLOGY CO., LTD., Qingdao (CN)

( * ) Notice: Subject to any disclaimer, the term of this patent is extended or adjusted under 35 U.S.C. 154(b) by 156 days.

(21) Appl. No.: 16/334,739

(22) PCT Filed: Dec. 29, 2016

(86) PCT No.: PCT/CN2016/113240
§ 371 (c)(1),
(2) Date: Mar. 19, 2019

(87) PCT Pub. No.: WO2018/064865
PCT Pub. Date: Apr. 12, 2018

(65) Prior Publication Data

US 2019/0391210 A1 Dec. 26, 2019

(30) Foreign Application Priority Data

Oct. 9, 2016 (CN) .......................... 201610881697.7

(51) Int. Cl.
*G01R 31/3842* (2019.01)
*G01R 31/388* (2019.01)
(Continued)

(52) U.S. Cl.
CPC ....... *G01R 31/3842* (2019.01); *G01R 31/388* (2019.01); *G01R 31/392* (2019.01); *G01R 31/36* (2013.01)

(58) Field of Classification Search
CPC ...... G01R 31/00; G01R 31/36; G01R 31/382; G01R 31/3835; G01R 31/3842;
(Continued)

(56) References Cited

U.S. PATENT DOCUMENTS 5,479,085 A * 12/1995 Honda ................. H02J 7/0078
320/134
2001/0022518 A1* 9/2001 Asakura ............... G01R 31/392
324/426
(Continued)

FOREIGN PATENT DOCUMENTS

CN 101153894 A 4/2008
CN 102231548 A 11/2011
(Continued)

OTHER PUBLICATIONS

International Search Report dated Jul. 12, 2017 for PCT Application No. PCT/CN2016/113240.

(Continued)

*Primary Examiner* — Hoai-An D. Nguyen
(74) *Attorney, Agent, or Firm* — Moser Taboada

(57) ABSTRACT

A method and apparatus for acquiring a battery capacity and an electronic device are provided. The method includes: acquiring a charging instruction; acquiring a discharging voltage value and its corresponding capacity and a voltage threshold of a battery to be detected according to the charging instruction; acquiring a charging capacity of the battery to be detected according to the discharging voltage value and the voltage threshold of the battery to be detected; and acquiring a capacity of the battery to be detected according to the capacity corresponding to the discharging voltage value of the battery to be detected and the charging capacity of the battery to be detected.

9 Claims, 2 Drawing Sheets

(51) Int. Cl.
*G01R 31/392* (2019.01)
*G01R 31/36* (2020.01)

(58) Field of Classification Search
CPC .. G01R 31/385; G01R 31/387; G01R 31/388; G01R 31/367; G01R 31/389; G01R 31/392
USPC .................................................. 324/425, 426
See application file for complete search history.

(56) References Cited

U.S. PATENT DOCUMENTS

| | | | | |
|---|---|---|---|---|
| 2002/0021110 A1* | 2/2002 | Nakagawa | ................ | H02J 7/34 320/136 |
| 2009/0243556 A1 | 10/2009 | Lu et al. | | |
| 2017/0214266 A1* | 7/2017 | Takahashi | ............. | H02J 7/0019 |
| 2020/0099216 A1* | 3/2020 | Chen | .................... | H02J 7/0031 |

FOREIGN PATENT DOCUMENTS

| | | |
|---|---|---|
| CN | 102231551 A | 11/2011 |
| CN | 103176135 A | 6/2013 |
| CN | 104112878 A | 10/2014 |
| CN | 104201727 A | 12/2014 |
| CN | 104297689 A | 1/2015 |
| CN | 105353316 A | 2/2016 |
| CN | 105372595 A | 3/2016 |

OTHER PUBLICATIONS

China Patent Application No. 201610881697.7 First Office Action and Search Report dated Nov. 16, 2018.

* cited by examiner

METHOD AND DEVICE FOR ACQUIRING BATTERY POWER LEVEL AND ELECTRONIC DEVICE

CROSS REFERENCE TO RELATED APPLICATIONS

This application is a U.S. National Stage entry under 35 U.S.C. § 371 based on International Application No. PCT/CN2016/113240, filed on Dec. 29, 2016, which was published under PCT Article 21(2) and which claims priority to Chinese Patent Application No. 201610881697.7, filed on Oct. 9, 2016. The embodiment of the priority applications are hereby incorporated herein in their entirety by reference.

TECHNICAL FIELD

The present disclosure relates to the field of power electronics, and in particular to a method and apparatus for acquiring a battery capacity and an electronic device.

BACKGROUND

With the continuous development of power electronics, various types of power electronic products have emerged. Most electronic products can use rechargeable batteries. Taking the lithium rechargeable battery as an example, the integral charging process of a lithium battery can be divided into three parts: trickle charging, constant current charging, and constant voltage charging. During the entire charging process, the charging voltage of the battery will be a little higher. For example, if the actual battery voltage is 3.6V, the battery may exhibit a voltage of 3.7V during the charging. In the actual use of electronic devices such as mobile phones, watches or bracelets, the battery capacity is updated at any time during the charging process. If the battery capacity displayed directly is the capacity corresponding to the battery voltage detected during charging, the displayed battery capacity will be a little larger and even full, although the actual battery capacity has not reached the displayed state yet.

In the prior art, a correspondence table between the actual voltage of the battery to be detected in an uncharged state and a virtual voltage during charging is generally used, the charging voltage is converted into an actual voltage through this correspondence table, and then the current battery capacity corresponding to the actual voltage is displayed to the user.

The inventors finds that the process of acquiring the battery capacity in the prior art has at least the following problems.

In the prior art, the actual capacity of the rechargeable battery to be detected is determined by looking up the correspondence table between the actual voltage and the virtual voltage. This method has the following problems. First, it needs a great amount of time and labor to detect the actual voltage and the virtual voltage and make the voltage correspondence table in advance. Second, the voltage correspondence table is susceptible to the detection environment, which results in large detection errors. Finally, the application range of the voltage correspondence table is limited and cannot be compatible with different electronic devices.

SUMMARY

The present disclosure provides a method and apparatus for acquiring a battery capacity and an electronic device to solve the problems in the prior art that, when determining the actual capacity of the rechargeable battery to be detected by looking up a correspondence table between the actual voltage and the virtual voltage, it needs a great amount of time and labor, detection errors are large due to the influence of the detection environment, and the application range is limited.

According to an aspect of the present disclosure, a method for acquiring a battery capacity is provided, and the method comprises:

acquiring a charging instruction;

acquiring a discharging voltage value and its corresponding capacity and a voltage threshold of a battery to be detected according to the charging instruction;

acquiring a charging capacity of the battery to be detected according to the discharging voltage value and the voltage threshold of the battery to be detected; and acquiring a capacity of the battery to be detected according to the capacity corresponding to the discharging voltage value of the battery to be detected and the charging capacity of the battery to be detected.

According to another aspect of the present disclosure, an apparatus for acquiring a battery capacity is provided, and the apparatus comprises:

an instruction receiving unit for acquiring a charging instruction;

an information acquiring unit for acquiring a discharging voltage value and its corresponding capacity and a voltage threshold of a battery to be detected according to the charging instruction;

a charging capacity acquiring unit for acquiring a charging capacity of the battery to be detected according to the discharging voltage value and the voltage threshold of the battery to be detected; and a battery capacity acquiring unit for acquiring a capacity of the battery to be detected according to the capacity corresponding to the discharging voltage value of the battery to be detected and the charging capacity of the battery to be detected.

According to still another aspect of the present disclosure, an electronic device is provided, and the electronic device comprises the apparatus for acquiring a battery capacity according to another aspect of the present disclosure.

The advantageous effects of the present disclosure are as follows.

In the method and apparatus for acquiring a battery capacity according to the present disclosure, firstly, a discharging voltage value and its corresponding capacity and a voltage threshold of the battery to be detected are automatically acquired according to the charging instruction; then, a charging capacity of the battery to be detected is acquired according to the discharging voltage value and the voltage threshold of the battery to be detected; and finally, a current capacity of the battery to be detected is acquired by summing the charging capacity of the battery to be detected and the capacity corresponding to the discharging voltage value of the battery to be detected.

In the technical solutions of the present disclosure, the current capacity of the battery to be detected is acquired by acquiring and updating the charging capacity of the battery to be detected in real time, so a great amount of time and labor for detection in advance are not needed. Moreover, in the technical solutions of the present disclosure, loop detection and updating are performed automatically and will not be affected by the external detection environment. Therefore, detection errors are small, and the capacity of the battery to be detected can be accurately acquired even in a low temperature environment, thereby solving the problem of large detection errors in the prior art which is resulted by the rapid rise of the battery voltage due to the increase of the internal resistance of the circuit in the low temperature environment. Moreover, in the technical solutions of the present disclosure, the charging capacity of the battery to be detected is acquired according to the discharging voltage value and the voltage threshold of the battery to be detected. Specifically, in the technical solutions of the present disclosure, the charging capacity of the battery to be detected is acquired according to actual parameters of the battery to be detected. Therefore, the method and apparatus for acquiring a battery capacity according to the present disclosure are applicable to various types of rechargeable batteries.

In addition, the present disclosure further provides an electronic device, which comprises the apparatus for acquiring a battery capacity according to the present disclosure. Thus, an application in the electronic device can display the charging capacity and the current capacity of the battery to be detected that are acquired by the apparatus for acquiring a battery capacity, so that the user can know the charging state of the rechargeable battery of the electronic device in real time, thereby improving the user experience.

Other features and advantages of the present disclosure will become more apparent from the detailed description of the embodiments in combination with the drawings.

DETAILED DESCRIPTION

One of conventional methods of acquiring the current battery capacity corresponding to the actual voltage during the charging process of an electronic device is determining the actual capacity of the rechargeable battery to be detected by looking up a correspondence table between the actual voltage and the virtual voltage. This method has the following problems. Firstly, it needs a great amount of time and labor to detect the actual voltage and the virtual voltage and make the voltage correspondence table in advance. Secondly, the voltage correspondence table is susceptible to the detection environment, which results in large detection errors. Finally, the application range of the voltage correspondence table is limited and cannot be compatible with different electronic devices.

The inventive concept of the present disclosure is as follows. In view of the problems in the prior art that, it needs a great amount of time and labor to detect the actual voltage and the virtual voltage and make the voltage correspondence table in advance, the voltage correspondence table is susceptible to the detection environment, which results in large detection errors, and the application range of the voltage correspondence table is limited and cannot be compatible with different electronic devices, in the present disclosure, a discharging voltage value and its corresponding capacity and a voltage threshold of the battery to be detected are automatically acquired according to the charging instruction; then, a charging capacity of the battery to be detected is acquired according to the discharging voltage value and the voltage threshold of the battery to be detected; and finally, a current capacity of the battery to be detected is acquired by summing the charging capacity of the battery to be detected and the capacity corresponding to the discharging voltage value of the battery to be detected. Thus, a great amount of time and labor for detection in advance are not needed.

Moreover, in the present disclosure, detecting and updating are performed automatically and will not be affected by the external detection environment. Therefore, detection errors are small.

In addition, in view of the problem in the prior art that the application range of the voltage correspondence table is limited and cannot be compatible with different electronic devices, the present disclosure proposes to acquire the charging capacity of the battery to be detected according to actual parameters of the battery to be detected, so it is applicable to various types of rechargeable batteries.

First Embodiment

Figure 1:
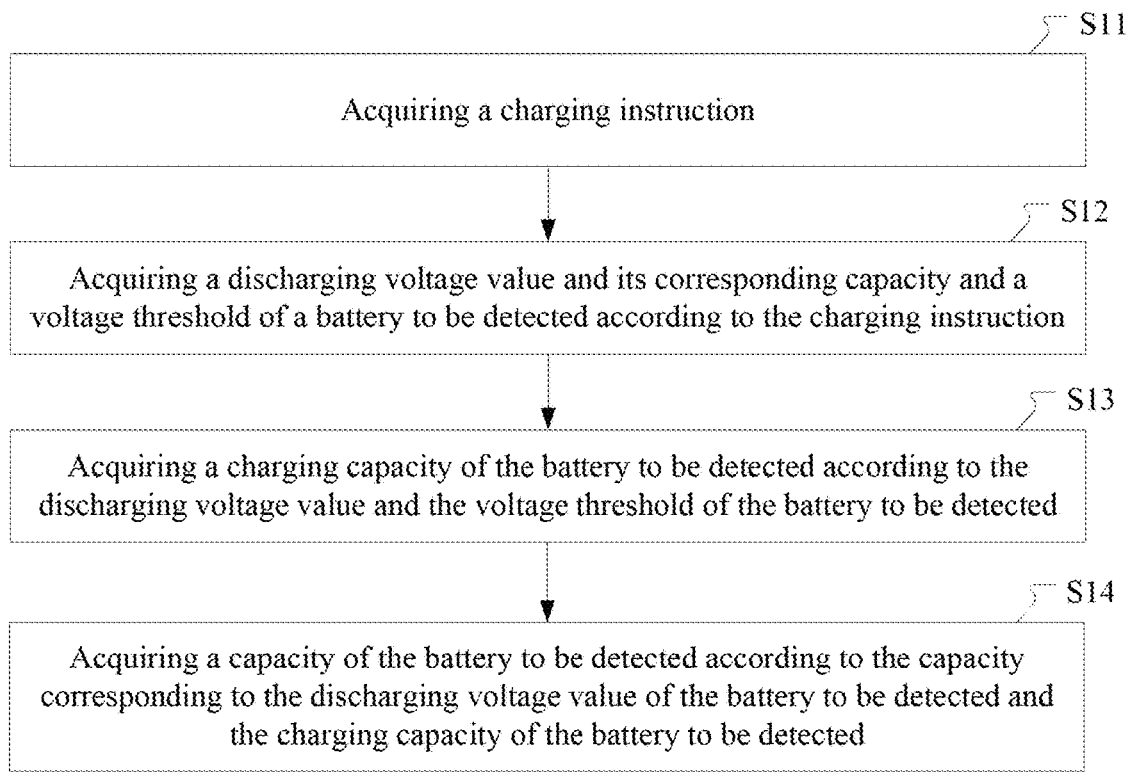
FIG. 1 is a flow chart of a method for acquiring a battery capacity according to an embodiment of the present disclosure.

FIG. 1 is a flow chart of a method for acquiring a battery capacity according to an embodiment of the present disclosure. Referring to FIG. 1, it is assumed that the battery to be detected in the present embodiment is a lithium battery. The charging process of the lithium battery (see FIG. 4) can be divided into three parts: trickle charging, constant current charging and constant voltage charging. Since the charging current for trickle charging is very small and the charging duration is very short, the trickle charging capacity is neglected in the present embodiment.

The method for acquiring a battery capacity according to the present disclosure comprises the following steps:

Step S11, acquiring a charging instruction.

In the present embodiment, the charging instruction is for initiating the process of acquiring the battery capacity, and is usually sent by the main board.

Step S12, acquiring a discharging voltage value and its corresponding capacity and a voltage threshold of a battery to be detected according to the charging instruction.

In the present embodiment, the discharging voltage value of the battery to be detected is the current actual voltage value of the battery to be detected, and its corresponding capacity is the current actual capacity of the rechargeable battery. The voltage threshold includes a lower limit voltage threshold and an upper limit voltage threshold. The lower limit voltage threshold is typically a voltage value at which the battery to be detected cannot output power. The upper limit voltage threshold is typically a voltage value at which the battery to be detected outputs the maximum power.

Step S13, acquiring a charging capacity of the battery to be detected according to the discharging voltage value and the voltage threshold of the battery to be detected.

In the present embodiment, the voltage threshold includes a lower limit voltage threshold $V_{lower}$ and an upper limit voltage threshold $V_{upper}$. The step S13 is implemented specifically as follows:

when the discharging voltage value $V_0$ of the battery to be detected does not reach the lower limit voltage threshold $V_{lower}$, taking the capacity $W_0$ corresponding to the discharging voltage value $V_0$ of the battery to be detected as the remaining capacity $W_{remaining}$ of the battery to be detected;

when the discharging voltage value $V_0$ of the battery to be detected reaches the lower limit voltage threshold $V_{lower}$, initiating a timer T1 to start timing;

when the discharging voltage value $V_0$ of the battery to be detected is not less than the lower limit voltage threshold $V_{lower}$ but less than the upper limit voltage threshold $V_{upper}$, keeping the timer T1 in a state of timing, and acquiring a constant current charging duration t1 and a constant current charging capacity W1 of the battery to be detected;

when the discharging voltage value $V_0$ of the battery to be detected reaches the upper limit voltage threshold $V_{upper}$, ending the timing of the timer T1, and simultaneously initiating a timer T3 to start timing; and when the discharging voltage value $V_0$ of the battery to be detected is not less than the upper limit voltage threshold $V_{upper}$, keeping the timer T3 in a state of timing, and acquiring a constant voltage charging duration t3 and a constant voltage charging capacity W3 of the battery to be detected.

Based on the above steps, the step of acquiring the constant current charging capacity W1 of the battery to be detected comprises:

acquiring the constant current charging duration t1 and a constant current charging current I1; and acquiring the constant current charging capacity W1 of the battery to be detected according to a product of the constant current charging duration t1 and the constant current charging current I1, that is, W1=I1*t1.

Based on the above steps, the step of acquiring the constant voltage charging capacity W3 of the battery to be detected comprises:

acquiring a nominal capacity $W_{nominal}$ of the battery to be detected;

acquiring a total constant voltage charging duration T2 and a total constant voltage charging capacity W2 according to the nominal capacity W nominal of the battery to be detected, the constant current charging current I1 of the battery to be detected and the constant current charging capacity W1 of the battery to be detected, that is, W2=$W_{nominal}$−W1=I1*T2/2; and acquiring the constant voltage charging capacity W3 of the battery to be detected according to the constant voltage charging duration t3 recorded by the timer T3, the total constant voltage charging duration T2 and the total constant voltage charging capacity W2.

Figure 4:
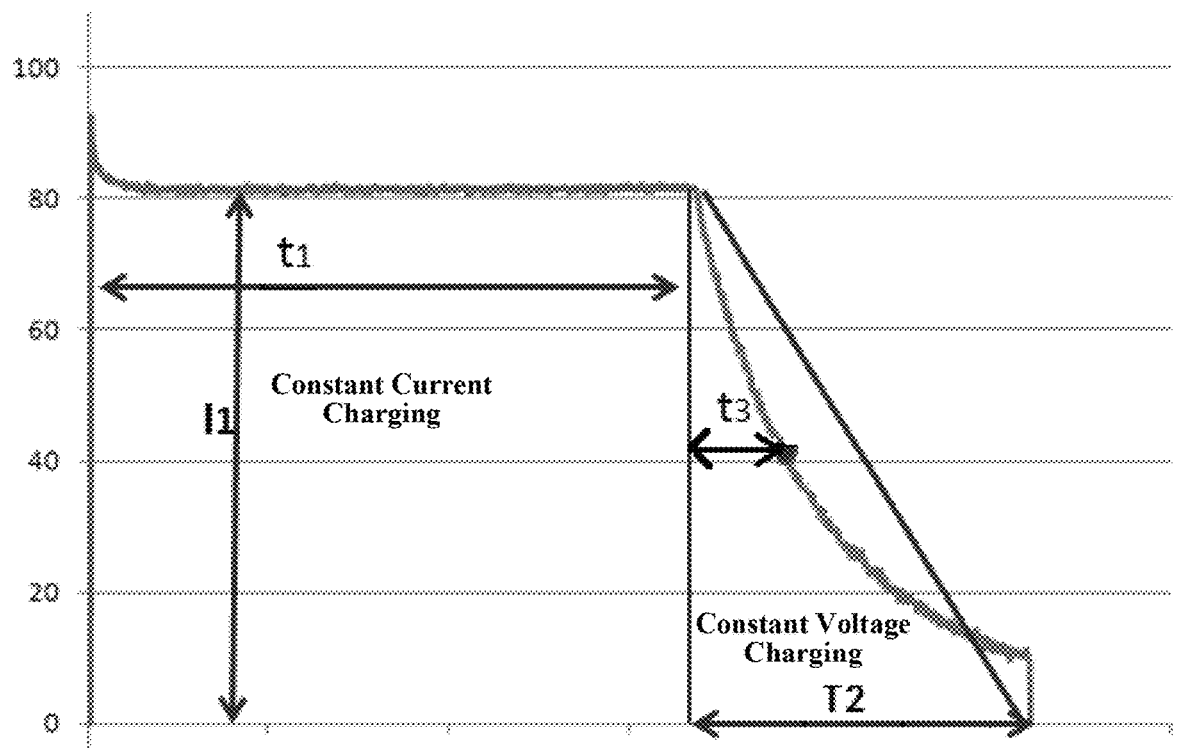
FIG. 4 is a schematic current versus time coordinate diagram in a battery charging process according to an embodiment of the present disclosure.

It should be noted that, in the present embodiment, the constant voltage charging phase in the schematic current versus time coordinate diagram of the battery charging process as shown in FIG. 4 is equivalent to the left triangle in FIG. 4, that is, W2=$W_{nominal}$−W1=I1*T2/2, and the total duration T2 required in the constant voltage charging phase can be estimated. The timing of t3 is started when the charging is switched from the constant current charging phase to the constant voltage charging phase. The charging capacity W3 in the constant voltage charging phase can be obtained from the ratio relation between the constant voltage charging duration t3 recorded by the timer T3 and the total duration T2 required in the constant voltage charging phase, that is, W3=$t3^2$*I1/2T2. The current total capacity of the battery to be detected is W=W1+W3.

Step S14: acquiring a capacity of the battery to be detected according to the capacity $W_0$ corresponding to the discharging voltage value of the battery to be detected and the charging capacity of the battery to be detected.

In the present embodiment, the step S14 is implemented specifically as follows:

when the discharging voltage value $V_0$ of the battery to be detected is not less than the lower limit voltage threshold $V_{lower}$ but less than the upper limit voltage threshold $V_{upper}$, taking the constant current charging capacity W1 of the battery to be detected as the charging capacity $W_{charging}$ of the battery to be detected, and acquiring the capacity W of the battery to be detected according to the capacity $W_0$ corresponding to the discharging voltage value of the battery to be detected and the constant current charging capacity W1 of the battery to be detected, that is, W=$W_0$+W1; and when the discharging voltage value of the battery to be detected is not less than the upper limit voltage threshold, taking the sum of the constant current charging capacity W1 of the battery to be detected and the constant voltage charging capacity W3 of the battery to be detected as the charging capacity $W_{charging}$ of the battery to be detected, that is, $W_{charging}$=W1+W3, and acquiring the capacity W of the battery to be detected according to the sum of the capacity $W_0$ corresponding to the discharging voltage value of the battery to be detected, the constant current charging capacity W1 of the battery to be detected and the constant voltage charging capacity W3 of the battery to be detected, that is, W=$W_0$+W1+W3.

Second Embodiment

Figure 2:
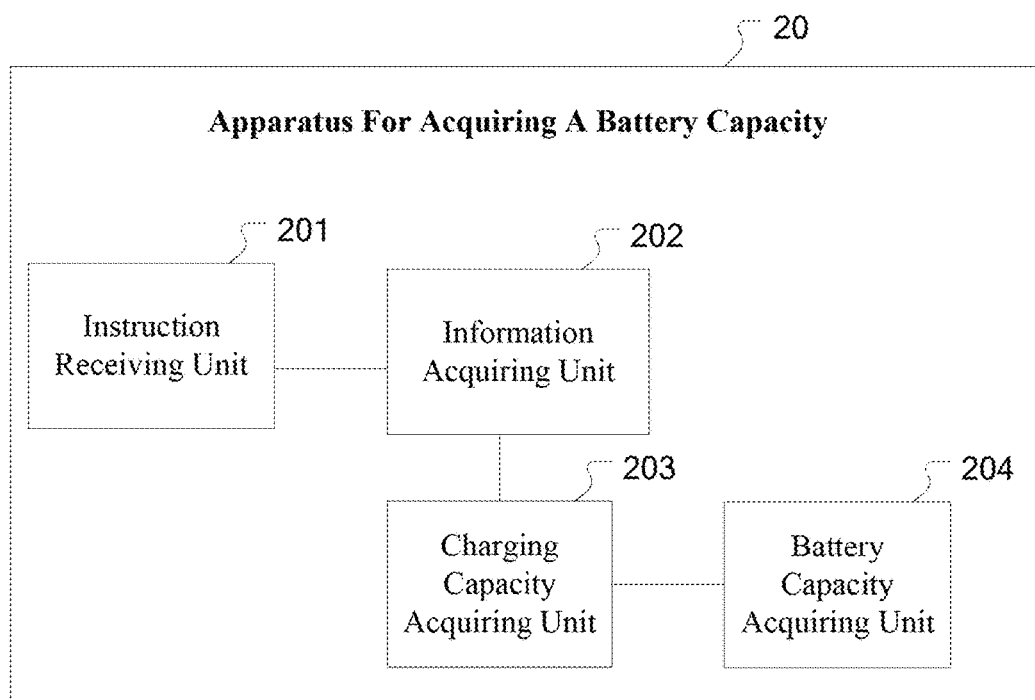
FIG. 2 is a block diagram of the structure of an apparatus for acquiring a battery capacity according to an embodiment of the present disclosure.

FIG. 2 is a block diagram of the structure of an apparatus for acquiring a battery capacity according to an embodiment of the present disclosure. The apparatus for acquiring a battery capacity 20 comprises:

an instruction receiving unit 201 for acquiring a charging instruction;

an information acquiring unit 202 for acquiring a discharging voltage value and corresponding capacity and voltage threshold of a battery to be detected according to the charging instruction;

a charging capacity acquiring unit 203 for acquiring a charging capacity of the battery to be detected according to the discharging voltage value and the voltage threshold of the battery to be detected; and a battery capacity acquiring unit 204 for acquiring a capacity of the battery to be detected according to the capacity $W_0$ corresponding to the discharging voltage value of the battery to be detected and the charging capacity of the battery to be detected.

In the present embodiment, the charging capacity acquiring unit 203 comprises:

a judging subunit for judging whether the discharging voltage value of the battery to be detected reaches the voltage threshold; and a charging capacity acquiring subunit for when the discharging voltage value of the battery to be detected does not reach a lower limit voltage threshold, taking a remaining capacity $W_{remaining}$ of the battery to be detected as the capacity $W_0$ corresponding to the discharging voltage value of the battery to be detected;

when the discharging voltage value of the battery to be detected reaches the lower limit voltage threshold, initiating a timer T1 to start timing;

when the discharging voltage value of the battery to be detected is not less than the lower limit voltage threshold but less than an upper limit voltage threshold, keeping the timer T1 in a state of timing, and acquiring a constant current charging duration t1 and a constant current charging capacity W1 of the battery to be detected;

when the discharging voltage value of the battery to be detected reaches the upper limit voltage threshold, ending the timing of the timer T1, and simultaneously initiating a timer T3 to start timing; and when the discharging voltage value of the battery to be detected is not less than the upper limit voltage threshold, keeping the timer T3 in a state of timing, and acquiring a constant voltage charging duration t3 and a constant voltage charging capacity W3 of the battery to be detected.

In the present embodiment, the charging capacity acquiring subunit is further for acquiring the constant current charging duration t1 and a constant current charging current I1; and acquiring the constant current charging capacity W1 of the battery to be detected according to a product of the constant current charging duration t1 and the constant current charging current I1.

In the present embodiment, the charging capacity acquiring subunit is further for acquiring a nominal capacity W nominal of the battery to be detected;

acquiring a total constant voltage charging duration T2 and a total constant voltage charging capacity W2 according to the nominal capacity W nominal of the battery to be detected, the constant current charging current I1 of the battery to be detected and the constant current charging capacity W1 of the battery to be detected; and acquiring the constant voltage charging capacity W3 of the battery to be detected according to the constant voltage charging duration t3 recorded by the timer T3, the total constant voltage charging duration T2 and the total constant voltage charging capacity W2.

In the present embodiment, the battery capacity acquiring unit is further for when the discharging voltage value of the battery to be detected is not less than the lower limit voltage threshold but less than the upper limit voltage threshold, taking the constant current charging capacity W1 of the battery to be detected as the charging capacity of the battery to be detected, and acquiring the capacity of the battery to be detected according to a sum of the capacity $W_0$ corresponding to the discharging voltage value of the battery to be detected and the constant current charging capacity W1 of the battery to be detected; and when the discharging voltage value of the battery to be detected is not less than the upper limit voltage threshold, taking a sum of the constant current charging capacity W1 of the battery to be detected and the constant voltage charging capacity W3 of the battery to be detected as the charging capacity of the battery to be detected, and acquiring the capacity of the battery to be detected according to a sum of the capacity $W_0$ corresponding to the discharging voltage value of the battery to be detected, the constant current charging capacity W1 of the battery to be detected and the constant voltage charging capacity W3 of the battery to be detected.

It should be noted that:

the working process of the apparatus for acquiring a battery capacity in the present embodiment is corresponding to the implementation steps of the foregoing method for acquiring a battery capacity, so the working process of the apparatus for acquiring a battery capacity in the present embodiment will not be repeated herein, and may refer to the related description of the foregoing embodiment of the present disclosure for details.

The embodiments of the components of the present disclosure can be implemented as hardware, as a software module executed on one or more processors, or as their combination. A person skilled in the art should understand that, microprocessors or digital signal processors (DSP) can be employed in practice to implement some or all of the functions of some or all of the components according to the embodiments of the present disclosure. The present disclosure can also be implemented as devices or device programs for executing some or all of the method described herein (for example, computer programs and computer program products). Such programs for implementing the present disclosure can be stored in computer readable media, or can be in the form of one or more signals. The present disclosure can be implemented by means of hardware that comprise numbers of different elements and by means of computers that are properly programmed.

Third Embodiment

Figure 3:
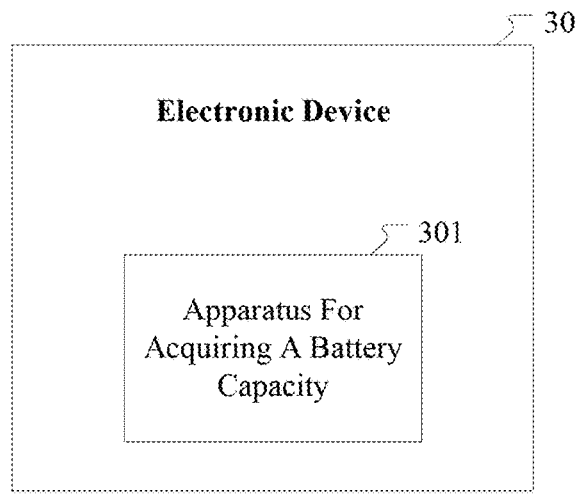
FIG. 3 is a block diagram of the structure of an electronic device according to an embodiment of the present disclosure.

FIG. 3 is a block diagram of the structure of an electronic device according to an embodiment of the present disclosure. Referring to FIG. 3, the electronic device 30 comprises an apparatus for acquiring a battery capacity 301. The implementation principle and working process of the apparatus for acquiring a battery capacity 301 may refer to the detailed description of the apparatus for acquiring a battery capacity 20 in the foregoing second embodiment.

The electronic device of the present disclosure traditionally comprises a processor and a computer program product or a computer readable medium in the form of memory. The memory has a storage space for executing the program code of any method step of the above method. For example, the storage space for the program code can comprise each of the program codes for individually implementing the steps of the above method. These program codes can be read out or written in from one or more computer program products to the one or more computer program products. Such computer program products are generally portable or fixed storage units. The storage units can be similarly disposed memory segments, storage spaces or the like. The program code can for example be compressed in appropriate forms. Generally, the storage units comprise computer readable codes for executing the method steps according to the present disclosure, that is, codes that can be read by for example processors, and when the codes are executed, the electronic device executes each of the steps of the method described above.

For example, the electronic device of the present disclosure comprising a processor and a computer readable medium, wherein the computer readable medium stores computer readable codes that are readable by the processor, and the processor executes these computer readable codes to perform the following steps:

acquiring a charging instruction;

acquiring a discharging voltage value and its corresponding capacity and a voltage threshold of a battery to be detected according to the charging instruction;

acquiring a charging capacity of the battery to be detected according to the discharging voltage value and the voltage threshold of the battery to be detected; and acquiring a capacity of the battery to be detected according to the capacity corresponding to the discharging voltage value of the battery to be detected and the charging capacity of the battery to be detected.

Wherein, the step of acquiring a charging capacity of the battery to be detected according to the discharging voltage value and the voltage threshold of the battery to be detected comprises:

judging whether the discharging voltage value of the battery to be detected reaches the voltage threshold, wherein the voltage threshold includes a lower limit voltage threshold and an upper limit voltage threshold, the lower limit voltage threshold is typically a voltage value at which the battery to be detected cannot output power, and the upper limit voltage threshold is typically a voltage value at which the battery to be detected outputs the maximum power;

when the discharging voltage value of the battery to be detected does not reach the lower limit voltage threshold, taking a remaining capacity $W_{remaining}$ of the battery to be detected as the capacity W0 corresponding to the discharging voltage value of the battery to be detected;

when the discharging voltage value of the battery to be detected reaches the lower limit voltage threshold, initiating a timer T1 to start timing;

when the discharging voltage value of the battery to be detected is not less than the lower limit voltage threshold but less than the upper limit voltage threshold, keeping the timer T1 in a state of timing, and acquiring a constant current charging duration t1 and a constant current charging capacity W1 of the battery to be detected;

when the discharging voltage value of the battery to be detected reaches the upper limit voltage threshold, ending the timing of the timer T1, and simultaneously initiating a timer T3 to start timing; and when the discharging voltage value of the battery to be detected is not less than the upper limit voltage threshold, keeping the timer T3 in a state of timing, and acquiring a constant voltage charging duration t3 and a constant voltage charging capacity W3 of the battery to be detected.

Wherein, the step of acquiring the constant current charging capacity W1 of the battery to be detected comprises:

acquiring the constant current charging duration t1 and a constant current charging current I1; and acquiring the constant current charging capacity W1 of the battery to be detected according to a product of the constant current charging duration t1 and the constant current charging current I1.

Wherein, the step of acquiring the constant voltage charging capacity W3 of the battery to be detected comprises:

acquiring a nominal capacity $W_{nominal}$ of the battery to be detected;

acquiring a total constant voltage charging duration T2 and a total constant voltage charging capacity W2 according to the nominal capacity $W_{nominal}$ of the battery to be detected, the constant current charging current I1 of the battery to be detected and the constant current charging capacity W1 of the battery to be detected; and acquiring the constant voltage charging capacity W3 of the battery to be detected according to the constant voltage charging duration t3 recorded by the timer T3, the total constant voltage charging duration T2 and the total constant voltage charging capacity W2.

Wherein, the step of acquiring a capacity of the battery to be detected according to the capacity corresponding to the discharging voltage value of the battery to be detected and the charging capacity of the battery to be detected comprises:

when the discharging voltage value of the battery to be detected is not less than the lower limit voltage threshold but less than the upper limit voltage threshold, taking the constant current charging capacity W1 of the battery to be detected as the charging capacity of the battery to be detected, and acquiring the capacity of the battery to be detected according to a sum of the capacity corresponding to the discharging voltage value of the battery to be detected and the constant current charging capacity W1 of the battery to be detected; and when the discharging voltage value of the battery to be detected is not less than the upper limit voltage threshold, taking a sum of the constant current charging capacity W1 of the battery to be detected and the constant voltage charging capacity W3 of the battery to be detected as the charging capacity of the battery to be detected, and acquiring the capacity of the battery to be detected according to a sum of the capacity corresponding to the discharging voltage value of the battery to be detected, the constant current charging capacity W1 of the battery to be detected and the constant voltage charging capacity W3 of the battery to be detected.

It should be noted that, the above embodiments are intended to illustrate the present disclosure, rather than limiting the present disclosure, and a person skilled in the art can design alternative embodiments without departing from the scope of the attached claims. The word "comprise" does not exclude the elements or steps that are not listed in the claims.

The advantageous effects of the present disclosure are as follows.

In the method and apparatus for acquiring a battery capacity according to the present disclosure, firstly, a discharging voltage value and corresponding capacity and voltage threshold of the battery to be detected are automatically acquired according to the charging instruction; then, a charging capacity of the battery to be detected is acquired according to the discharging voltage value and the voltage threshold of the battery to be detected; and finally, a current capacity of the battery to be detected is acquired by summing the charging capacity of the battery to be detected and the capacity corresponding to the discharging voltage value of the battery to be detected.

In the technical solutions of the present disclosure, the current capacity of the battery to be detected is acquired by acquiring and updating the charging capacity of the battery to be detected in real time, so a great amount of time and labor for detection in advance are not needed. Moreover, in the technical solutions of the present disclosure, loop detection and updating are performed automatically and will not be affected by the external detection environment. Therefore, detection errors are small, and the capacity of the battery to be detected can be accurately acquired even in a low temperature environment, thereby solving the problem of large detection errors in the prior art which is resulted by the rapid rise of the battery voltage due to the increase of the internal resistance of the circuit in the low temperature environment.

Moreover, in the technical solutions of the present disclosure, the charging capacity of the battery to be detected is acquired according to the discharging voltage value and the voltage threshold of the battery to be detected. Specifically, in the technical solutions of the present disclosure, the charging capacity of the battery to be detected is acquired according to actual parameters of the battery to be detected. Therefore, the method and apparatus for acquiring a battery capacity according to the present disclosure are applicable to various types of rechargeable batteries.

In addition, the present disclosure further provides an electronic device, which comprises the apparatus for acquiring a battery capacity according to the present disclosure.

Thus, an application in the electronic device can display the charging capacity and the current capacity of the battery to be detected according to the charging capacity of the battery to be detected and the capacity of the battery to be detected that are acquired by the apparatus for acquiring a battery capacity, so that the user can know the charging state of the rechargeable battery of the electronic device in real time, thereby improving the user experience.

The embodiments of the present disclosure have been described above in an illustrative and non-exhaustive manner. The present disclosure is not limited to the embodiments disclosed herein. Various modifications and changes will be apparent to those skilled in the art without departing from the scope and spirit of the embodiments. The selection of the terms used herein is intended to best explain the principles, practical applications, or technical improvements of the embodiments, or to enable other skilled persons in the art to understand the embodiments disclosed herein. The scope of the present disclosure is defined by the appended claims.

What is claimed is:

1. A method for acquiring a battery capacity, comprising: acquiring a charging instruction;
acquiring a discharging voltage value and its corresponding capacity and a voltage threshold of a battery to be detected according to the charging instruction;
acquiring a charging capacity of the battery to be detected according to the discharging voltage value and the voltage threshold of the battery to be detected; and
acquiring a capacity of the battery to be detected according to the capacity corresponding to the discharging voltage value of the battery to be detected and the charging capacity of the battery to be detected;
wherein the step of acquiring a charging capacity of the battery to be detected according to the discharging voltage value and the voltage threshold of the battery to be detected comprises:
judging whether the discharging voltage value of the battery to be detected reaches the voltage threshold, wherein the voltage threshold includes a lower limit voltage threshold and an upper limit voltage threshold, the lower limit voltage threshold is typically a voltage value at which the battery to be detected cannot output power, and the upper limit voltage threshold is typically a voltage value at which the battery to be detected outputs the maximum power;
when the discharging voltage value of the battery to be detected does not reach the lower limit voltage threshold, taking a remaining capacity $W_{remaining}$ of the battery to be detected as the capacity W0 corresponding to the discharging voltage value of the battery to be detected;
when the discharging voltage value of the battery to be detected reaches the lower limit voltage threshold, initiating a timer T1 to start timing;
when the discharging voltage value of the battery to be detected is not less than the lower limit voltage threshold but less than the upper limit voltage threshold, keeping the timer T1 in a state of timing, and acquiring a constant current charging duration t1 and a constant current charging capacity W1 of the battery to be detected;
when the discharging voltage value of the battery to be detected reaches the upper limit voltage threshold, ending the timing of the timer T1, and simultaneously initiating a timer T3 to start timing; and
when the discharging voltage value of the battery to be detected is not less than the upper limit voltage threshold, keeping the timer T3 in a state of timing, and acquiring a constant voltage charging duration t3 and a constant voltage charging capacity W3 of the battery to be detected; and
wherein the step of acquiring the constant voltage charging capacity W3 of the battery to be detected comprises:
acquiring a nominal capacity $W_{nominal}$ of the battery to be detected;
acquiring a total constant voltage charging duration T2 and a total constant voltage charging capacity W2 according to the nominal capacity $W_{nominal}$ of the battery to be detected, the constant current charging current I1 of the battery to be detected and the constant current charging capacity W1 of the battery to be detected; and
acquiring the constant voltage charging capacity W3 of the battery to be detected according to the constant voltage charging duration t3 recorded by the timer T3, the total constant voltage charging duration T2 and the total constant voltage charging capacity W2.

2. The method according to claim 1, wherein the step of acquiring a capacity of the battery to be detected according to the capacity corresponding to the discharging voltage value of the battery to be detected and the charging capacity of the battery to be detected comprises:
when the discharging voltage value of the battery to be detected is not less than the lower limit voltage threshold but less than the upper limit voltage threshold, taking the constant current charging capacity W1 of the battery to be detected as the charging capacity of the battery to be detected, and acquiring the capacity of the battery to be detected according to a sum of the capacity W0 corresponding to the discharging voltage value of the battery to be detected and the constant current charging capacity W1 of the battery to be detected; and
when the discharging voltage value of the battery to be detected is not less than the upper limit voltage threshold, taking a sum of the constant current charging capacity W1 of the battery to be detected and the constant voltage charging capacity W3 of the battery to be detected as the charging capacity of the battery to be detected, and acquiring the capacity of the battery to be detected according to a sum of the capacity W0 corresponding to the discharging voltage value of the battery to be detected, the constant current charging capacity W1 of the battery to be detected and the constant voltage charging capacity W3 of the battery to be detected.

3. The method according to claim 1, wherein the step of acquiring the constant current charging capacity W1 of the battery to be detected comprises:
acquiring the constant current charging duration t1 and a constant current charging current I1; and
acquiring the constant current charging capacity W1 of the battery to be detected according to a product of the constant current charging duration t1 and the constant current charging current I1.

4. An apparatus for acquiring a battery capacity, comprising: an instruction receiving unit for acquiring a charging instruction;
an information acquiring unit for acquiring a discharging voltage value and its corresponding capacity and a voltage threshold of a battery to be detected according to the charging instruction;

a charging capacity acquiring unit for acquiring a charging capacity of the battery to be detected according to the discharging voltage value and the voltage threshold of the battery to be detected; and a battery capacity acquiring unit for acquiring a capacity of the battery to be detected according to the capacity corresponding to the discharging voltage value of the battery to be detected and the charging capacity of the battery to be detected;

wherein the charging capacity acquiring unit comprises:
a judging subunit for judging whether the discharging voltage value of the battery to be detected reaches the voltage threshold, wherein the voltage threshold includes a lower limit voltage threshold and an upper limit voltage threshold, the lower limit voltage threshold is typically a voltage value at which the battery to be detected cannot output power, and the upper limit voltage threshold is typically a voltage value at which the battery to be detected outputs the maximum power; and a charging capacity acquiring subunit for
when the discharging voltage value of the battery to be detected does not reach the lower limit voltage threshold, taking a remaining capacity $W_{remaining}$ of the battery to be detected as the capacity $W0$ corresponding to the discharging voltage value of the battery to be detected;

when the discharging voltage value of the battery to be detected reaches the lower limit voltage threshold, initiating a timer T1 to start timing;

when the discharging voltage value of the battery to be detected is not less than the lower limit voltage threshold but less than the upper limit voltage threshold, keeping the timer T1 in a state of timing, and acquiring a constant current charging duration t1 and a constant current charging capacity W1 of the battery to be detected;

when the discharging voltage value of the battery to be detected reaches the upper limit voltage threshold, ending the timing of the timer T1, and simultaneously initiating a timer T3 to start timing; and when the discharging voltage value of the battery to be detected is not less than the upper limit voltage threshold, keeping the timer T3 in a state of timing, and acquiring a constant voltage charging duration t3 and a constant voltage charging capacity W3 of the battery to be detected; and wherein the charging capacity acquiring subunit is further for
acquiring a nominal capacity $W_{nominal}$ of the battery to be detected;

acquiring a total constant voltage charging duration T2 and a total constant voltage charging capacity W2 according to the nominal capacity $W_{nominal}$ of the battery to be detected, the constant current charging current I1 of the battery to be detected and the constant current charging capacity W1 of the battery to be detected; and acquiring the constant voltage charging capacity W3 of the battery to be detected according to the constant voltage charging duration t3 recorded by the timer T3, the total constant voltage charging duration T2 and the total constant voltage charging capacity W2.

5. The apparatus according to claim 4, wherein the charging capacity acquiring subunit is further for
acquiring the constant current charging duration t1 and a constant current charging current I1; and acquiring the constant current charging capacity W1 of the battery to be detected according to a product of the constant current charging duration t1 and the constant current charging current I1.

6. The apparatus according to claim 4, wherein the battery capacity acquiring unit is further for
when the discharging voltage value of the battery to be detected is not less than the lower limit voltage threshold but less than the upper limit voltage threshold, taking the constant current charging capacity W1 of the battery to be detected as the charging capacity of the battery to be detected, and acquiring the capacity of the battery to be detected according to a sum of the capacity corresponding to the discharging voltage value of the battery to be detected and the constant current charging capacity W1 of the battery to be detected; and when the discharging voltage value of the battery to be detected is not less than the upper limit voltage threshold, taking a sum of the constant current charging capacity W1 of the battery to be detected and the constant voltage charging capacity W3 of the battery to be detected as the charging capacity of the battery to be detected, and acquiring the capacity of the battery to be detected according to a sum of the capacity corresponding to the discharging voltage value of the battery to be detected, the constant current charging capacity W1 of the battery to be detected and the constant voltage charging capacity W3 of the battery to be detected.

7. An electronic device, comprising a processor and a computer readable medium, wherein the computer readable medium stores computer readable codes that are readable by the processor, and the processor executes these computer readable codes to perform the following steps:
acquiring a charging instruction;
acquiring a discharging voltage value and its corresponding capacity and a voltage threshold of a battery to be detected according to the charging instruction;
acquiring a charging capacity of the battery to be detected according to the discharging voltage value and the voltage threshold of the battery to be detected; and
acquiring a capacity of the battery to be detected according to the capacity corresponding to the discharging voltage value of the battery to be detected and the charging capacity of the battery to be detected;
wherein the step of acquiring a charging capacity of the battery to be detected according to the discharging voltage value and the voltage threshold of the battery to be detected comprises:
judging whether the discharging voltage value of the battery to be detected reaches the voltage threshold, wherein the voltage threshold includes a lower limit voltage threshold and an upper limit voltage threshold, the lower limit voltage threshold is typically a voltage value at which the battery to be detected cannot output power, and the upper limit voltage threshold is typically a voltage value at which the battery to be detected outputs the maximum power;
when the discharging voltage value of the battery to be detected does not reach the lower limit voltage threshold, taking a remaining capacity $W_{remaining}$ of the battery to be detected as the capacity $W0$ corresponding to the discharging voltage value of the battery to be detected;
when the discharging voltage value of the battery to be detected reaches the lower limit voltage threshold, initiating a timer T1 to start timing;

when the discharging voltage value of the battery to be detected is not less than the lower limit voltage threshold but less than the upper limit voltage threshold, keeping the timer T1 in a state of timing, and acquiring a constant current charging duration t1 and a constant current charging capacity W1 of the battery to be detected;

when the discharging voltage value of the battery to be detected reaches the upper limit voltage threshold, ending the timing of the timer T1, and simultaneously initiating a timer T3 to start timing; and when the discharging voltage value of the battery to be detected is not less than the upper limit voltage threshold, keeping the timer T3 in a state of timing, and acquiring a constant voltage charging duration t3 and a constant voltage charging capacity W3 of the battery to be detected; and wherein the step of acquiring the constant voltage charging capacity W3 of the battery to be detected comprises:

acquiring a nominal capacity $W_{nominal}$ of the battery to be detected;

acquiring a total constant voltage charging duration T2 and a total constant voltage charging capacity W2 according to the nominal capacity $W_{nominal}$ of the battery to be detected, the constant current charging current I1 of the battery to be detected and the constant current charging capacity W1 of the battery to be detected; and acquiring the constant voltage charging capacity W3 of the battery to be detected according to the constant voltage charging duration t3 recorded by the timer T3, the total constant voltage charging duration T2 and the total constant voltage charging capacity W2.

8. The electronic device according to claim 7, wherein the step of acquiring the constant current charging capacity W1 of the battery to be detected comprises:

acquiring the constant current charging duration t1 and a constant current charging current I1; and acquiring the constant current charging capacity W1 of the battery to be detected according to a product of the constant current charging duration t1 and the constant current charging current I1;

wherein the step of acquiring the constant voltage charging capacity W3 of the battery to be detected comprises:

acquiring a nominal capacity $W_{nominal}$ of the battery to be detected;

acquiring a total constant voltage charging duration T2 and a total constant voltage charging capacity W2 according to the nominal capacity Wnominal of the battery to be detected, the constant current charging current I1 of the battery to be detected and the constant current charging capacity W1 of the battery to be detected; and acquiring the constant voltage charging capacity W3 of the battery to be detected according to the constant voltage charging duration t3 recorded by the timer T3, the total constant voltage charging duration T2 and the total constant voltage charging capacity W2.

9. The electronic device according to claim 7, wherein the step of acquiring a capacity of the battery to be detected according to the capacity corresponding to the discharging voltage value of the battery to be detected and the charging capacity of the battery to be detected comprises:

when the discharging voltage value of the battery to be detected is not less than the lower limit voltage threshold but less than the upper limit voltage threshold, taking the constant current charging capacity W1 of the battery to be detected as the charging capacity of the battery to be detected, and acquiring the capacity of the battery to be detected according to a sum of the capacity corresponding to the discharging voltage value of the battery to be detected and the constant current charging capacity W1 of the battery to be detected; and when the discharging voltage value of the battery to be detected is not less than the upper limit voltage threshold, taking a sum of the constant current charging capacity W1 of the battery to be detected and the constant voltage charging capacity W3 of the battery to be detected as the charging capacity of the battery to be detected, and acquiring the capacity of the battery to be detected according to a sum of the capacity corresponding to the discharging voltage value of the battery to be detected, the constant current charging capacity W1 of the battery to be detected and the constant voltage charging capacity W3 of the battery to be detected.

* * * * *